(12) United States Patent
Kanesashi

(10) Patent No.: US 7,407,388 B2
(45) Date of Patent: Aug. 5, 2008

(54) SOCKET FOR TESTING ELECTRICAL PARTS

(75) Inventor: Hokuto Kanesashi, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 11/697,444

(22) Filed: Apr. 6, 2007

(65) Prior Publication Data

US 2007/0243727 A1 Oct. 18, 2007

(30) Foreign Application Priority Data

Apr. 13, 2006 (JP) .............. 2006-110799

(51) Int. Cl.
*H01R 11/22* (2006.01)
(52) U.S. Cl. .......................... 439/73; 439/73
(58) Field of Classification Search .............. 439/73, 439/266, 268, 331
See application file for complete search history.

(56) References Cited

U.S. PATENT DOCUMENTS

| 4,077,694 | A |   | 3/1978 | Cobaugh et al. |         |
|-----------|---|---|--------|---------------|---------|
| 4,245,877 | A | * | 1/1981 | Auriana ....................... | 439/268 |
| 4,472,017 | A |   | 9/1984 | Sian |         |
| 5,545,050 | A | * | 8/1996 | Sato et al. ................... | 439/331 |
| 6,027,355 | A | * | 2/2000 | Ikeya ......................... | 439/268 |
| 6,261,114 | B1| * | 7/2001 | Shimada ...................... | 439/266 |
| 6,280,219 | B1| * | 8/2001 | Sano et al. ................... | 439/268 |
| 6,296,505 | B1| * | 10/2001| Fukunaga et al. ............. | 439/268 |
| 6,371,783 | B1| * | 4/2002 | Ohashi et al. ................ | 439/268 |
| 7,165,986 | B2| * | 1/2007 | Hayakawa .................... | 439/268 |
| 2006/0094279 | A1 | | 5/2006 | Hayakawa |         |

FOREIGN PATENT DOCUMENTS

| JP | 10-189109 | 7/1998 |
| JP | 2000-21531 | 1/2000 |
| JP | 2003-157944 | 5/2003 |

OTHER PUBLICATIONS

UK Search Report dated Aug. 13, 2007 for corresponding UK Patent Application No. 0707124.4.

* cited by examiner

*Primary Examiner*—Michael C. Zarroli
(74) *Attorney, Agent, or Firm*—Staas & Halsey LLP (57) ABSTRACT

A socket for an electrical part has a socket body 14 and a contact pin 15. The contact pin 15 has a fixed portion 15e fixed to a through hole 14d of the socket body 14, a plate-like elastic pieces 15b extending upward from the fixed portion 15e and a contact portion 15c to contact the electrical part. The elastic piece 15b is elastically deformable along a plate surface of the elastic piece so as to cause the contact portion to contact to and separate from a terminal of the electrical part. A biting portion 15f formed between the fixed portion 15e and the contact portion 15c for biting a bitten portion 14h formed on an inner wall of the through hole 14d. When the biting portion 15f bites the bitten portion 14h, vertical movement of the contact pin 15 is restricted and also a preload is given to the elastic pieces 15b in a direction of closing the contact portion 15c of the elastic piece 15b.

6 Claims, 9 Drawing Sheets

SOCKET FOR TESTING ELECTRICAL PARTS

BACKGROUND OF THE INVENTION

1. Field of the Invention

The present invention relates to a socket for an electrical part for use, for example, in testing the electrical part after mounting the electrical part such as semiconductor device or the like on the socket, more particularly, relates to an improvement of a socket for an electrical part in which a contact pin having an elastic piece, which is inserted into through holes of both a socket body and a movable member and is elastically deformable when the movable member is moved.

2. Related Art of the Invention

In a known art, there has been provided a socket for an electrical part for use such as in testing an electrical part by electrically connecting the electrical part such as a semiconductor device (hereinafter called "IC package") etc. to a wiring board. Such conventional socket has, for example, a socket body placed on the wiring board, a movable member movably disposed on the socket body, contact pins each inserted into respective through holes formed in both the socket body and the movable member. The contact pin has a lower edge portion which is connected to an electrode of the wiring board and a contact portion provided at its upper edge portion, which is contacted to a terminal of the electrical part.

The lower edge portion side of the contact pin is fixed to the socket body and the upper edge portion thereof is provided with the contact portion designed to be contacted to the terminal of the electrical part. Further, a portion between the upper edge portion and the lower edge portion is designed to be elastically deformable (this portion is called hereinafter the "elastic piece"). When the movable member is moved, this elastic piece is elastically deformed such that the contact portion of the contact pin is contacted to the terminal of the electrical part by using this resulting elastic force.

Such type of known contact pins has a pair of elastic contact pieces extending in parallel. A pressed portion is provided on at least one of the elastic contact pieces for opening and closing the elastic piece. When the pressed portion is pressed by the movable member, one of the elastic pieces is structured to be opened or closed with respect to the other elastic piece (for example Patent document 1: Japanese patent publication JP2003-157944 A1).

Another type of contact pin is also disclosed which has a pair of elastic pieces each having a contact portion at its end edge to be contacted to a terminal of the electrical part. At the middle portion of the elastic pieces, bent portions are formed such that bent portions are each bent toward a direction opposite to each other. And when the contact pin is disposed in the socket body, the apexes of the bent portions are pressed by preload means to give a preload to the elastic pieces (Patent document 2: Japanese patent publication JP2000-21531 A1).

However, in such conventional contact pins, a fixed portion of the contact pin is, for example, press-fixed or the like to the socket body so that the fixed portion would not be displaced when the elastic piece extending upward from the fixed portion is elastically deformed. Therefore, much working time is required for mounting the contact pin. Furthermore, the contact pin is usually secured so tightly to the socket body that there is no freedom in changing or adjusting the position or direction of the contact pin after the contact pin is once tightly secured to the socket body. And in a case where positional displacement between the through holes of the socket body and the movable member is occurred due to manufacturing errors, insertion of the contact pin can hardly be carried out smoothly, taking a lot of time in assembling the socket.

In addition, the conventional contact pin is produced by bending a plate-like elastic piece, differences in the shape of the contact pin can be occurred, resulting in a difference in the contact pin's elasticity.

Therefore, when the preload is given to the contact pin as shown in the above mentioned Patent document 2, difference in the amount of preload for each elastic piece is likely to occur, thus being inconvenient and disadvantageous.

SUMMARY OF THE INVENTION

An object of the present invention is to provide a socket for electrical parts in which a contact pin can be assembled easily, and a preload can be given accurately to the contact pin.

This and other objects can be achieved by providing a socket for an electrical part which comprises:

a socket body; and a contact pin having a contact portion for contacting a terminal of the electrical part, the contact pin being disposed in the socket body by being inserted into a through hole of the socket body, wherein the contact pin comprises a fixed portion by which the contact pin is fixed on the socket body, and a plate-like elastic piece extending upward from the fixed portion;

the fixed portion is fixed when the fixed portion is inserted into the through hole of the socket body; the elastic piece of the contact pin is formed to be elastically deformable in a plate-width direction of the elastic piece such that the contact portion of the contact pin is contacted to and separated from the terminal; the contact pin being provided with a biting portion located between the fixed portion and the contact portion and protruding along a plate surface in the plate-width direction, and designed to bite an inner wall of the through hole of the socket body;

a bitten portion at which the biting portion bites the bitten portion is formed on the inner wall; and when the biting portion bites the bitten portion on the inner wall, vertical movement of the contact pin is restricted and at the same time a preload is given to the elastic piece in a direction of closing the contact portion of the elastic piece because the biting portion is pressed by the inner wall.

Another aspect of the present invention is characterized in that a movable member movable with respect to the socket body is disposed on an upper side of the socket body; an operation portion which is inserted into a through hole of the movable member and is pressed at the time the movable member is moved is provided on the elastic piece of the contact pin; and the operation portion and the biting portion are protruded in a direction opposite to each other.

Still another aspect of the present invention is characterized in that the movable member is disposed to be vertically movable with respect to the socket body; and the operation portion of the contact pin is pressed at the time of downward movement of the movable member.

Another aspect of the present invention is characterized in that insertion of the contact pin into the through hole of the socket body is carried out by inserting an end edge of the contact portion side of the contact pin into the through hole from the lower side of the through hole; and the through hole has an abutting portion to which an upper edge of the fixed portion is abutted so as to restrict an upward movement of the contact pin.

Another aspect of the present invention is characterized in that a guiding surface is formed at a lower portion of the bitten portion, on which the biting portion slides at the time of insertion of the contact pin; and the guiding surface is formed such that a distance between the inner walls opposite to each other is made narrower toward the upward direction from the lower portion of the bitten portion.

Another aspect of the present invention is characterized in that the elastic piece is a pair of elastic pieces, and the plate surfaces of the elastic pieces in the plate-width direction are placed opposite to each other.

Another aspect of the present invention is characterized in that the pair of elastic pieces has a protrusion formed on at least one of the pair of elastic pieces and in the vicinities of both or either one of the biting portion and the operation portion, the protrusion slides on a surface of the other elastic piece opposite to the protrusion.

According to the aspect of the present invention, the contact pin is provided with a biting portion which is located between the fixed portion and the contact portion and bites the bitten portion on the inner wall of the through hole of the socket body, therefore the vertical movement of the contact pin is restricted when the biting portion bites the bitten portion on the inner wall. In the present invention, unlike with the conventional socket body in which the fixed portion is pressed into the through hole tightly by strong force, the contact pin can be fixed securely to the socket body by small force. The biting portion which restricts the vertical movement of the contact pin is positioned at a place closer to the side of the contact portion than that of the fixed portion which only restricts the upward movement of the contact pin, and the biting portion is supported between the contact portion and the fixed portion, thus the contact portion can be shifted somewhat rotatably around the biting portion as supporting point. Therefore, even if there is a small displacement of the through hole of the socket body with respect, for example, to the through hole or the like of the movable member, the assembling process of the socket can be carried out with effectively absorbing such displacement.

In addition, the elastic piece is elastically deformable in a direction of the plate width of the elastic piece in order for the contact portion of the contact pin to be contacted to and separated from the terminal of the electrical part and the biting portion is provided to protrude along the plate surface in the plate-width direction of the plate-like surface, therefore the biting portion can be formed easily and accurately with respect to the elastic piece, being able to give the preload accurately to the elastic piece.

According to another and still another aspects of the present invention, a movable member is provided on an upper side of the socket body. An operation portion, which is inserted into a through hole of the movable member and pressed at the time the movable member is moved, is provided on the elastic piece of the contact pin. And the operation portion and the biting portion are protruded in a direction opposite to each other. Therefore, the position of the elastic piece is accurately controlled at the two portions of both the lower biting portion and the upper operation portion by the through holes of the socket body and the movable member so that the elastic piece can accurately and easily hold a normal posture.

According to another aspect of the present invention, insertion of the contact pin can be carried out by firstly inserting an end edge of the contact portion side of the contact pin into the through hole from the lower side of the through hole, and the socket body is provided with an abutting portion which abuts on an upper edge of the fixed portion so as to restrict an upper movement of the contact pin. Therefore, the contact portion of the contact pin can be accurately positioned at a prescribed height by inserting the contact pin into the through hole from beneath the socket body and making the contact pin abut on the abutting portion.

According to another aspect of the present invention, a guiding surface is provided at a lower portion of the bitten portion, on which the biting portion slidably moves at the time the contact pin is inserted. And the guiding surface is configured such that the inner wall is made narrower toward an upward direction from the lower portion of the bitten portion. Therefore, when the contact pin is inserted into the through hole of the socket body, the biting portion is not pressed by the inner wall until the biting portion reaches to the guiding surface so that the inner wall of the through hole is prevented from being scraped away. Thereafter the biting portion is smoothly guided due to the presence of the guiding surface. Accordingly, the contact pin can be easily inserted.

According to another aspect of the present invention, the elastic piece is a pair of elastic pieces, and the plate surfaces of the elastic pieces are each placed opposite to each other. Therefore, the vertical movement of the contact pins is restricted by making each biting portion of the elastic pieces bite into each inner wall opposite to each other, and the contact pin can be securely fixed to the socket body. In addition, the terminal of the electrical part is elastically contacted to the contact portions of the elastic pieces, therefore the terminal of the electrical part can be clamped by a moderate contact pressure.

According to another aspect of the present invention, the pair of elastic pieces has a protrusion formed on at least one of the pair of elastic pieces and in the vicinities of both or either one of the biting portion and the operation portion, and the protrusion slides on a surface of the other elastic piece opposite to the protrusion. Therefore, a distance between the pair of elastic pieces in a thickness direction of the elastic pieces at both lower and upper sides can be easily controlled so that each elastic piece can be operated smoothly.

BRIEF DESCRIPTION OF THE DRAWINGS

In the accompanying drawings:

FIG. 4A and FIG. 4B show a contact pin of the first embodiment of the present invention, FIG. 4A is a front view and FIG. 4B is a side view, respectively;

FIG. 5A to FIG. 5C show an operation of the contact pin of the first embodiment of the present invention, FIG. 5A is a closing state of the contact portion, FIG. 5B is an opening state, and FIG. 5C is a state in which a terminal of an IC package is clamped, respectively;

FIG. 6A and FIG. 6B show an enlarged essential part of a base of the IC socket of the first embodiment of the present invention, FIG. 6A is a plan view, and FIG. 6B is a sectional view, respectively;

FIG. 8A and FIG. 8B show an IC package, FIG. 8A is a front view and FIG. 5B is a bottom view, respectively.

DETAILED DESCRIPTION

Preferred embodiments of the present invention will be described hereunder with reference to the accompanying drawings.

First Embodiment

FIGS. 1 to 8B represent a first embodiment of the present invention. Further, it is first to be noted that terms "right", "upper", "lower" and the like terms are used herein with reference to the illustrated state on the drawings or in a generally using state of the socket for electrical parts.

Firstly structural explanation will be presented. Reference numeral 11 shows an IC socket as a "socket for an electrical part". This IC socket 11 accommodates an IC package 12 as an "electrical part" (refer to FIGS. 5A, 5B, 5C and FIGS. 8A, 8B) to conduct a burn-in test etc. of the IC package 12 by electrically connecting the IC package 12 and a wiring board (not shown).

Figure 8A:
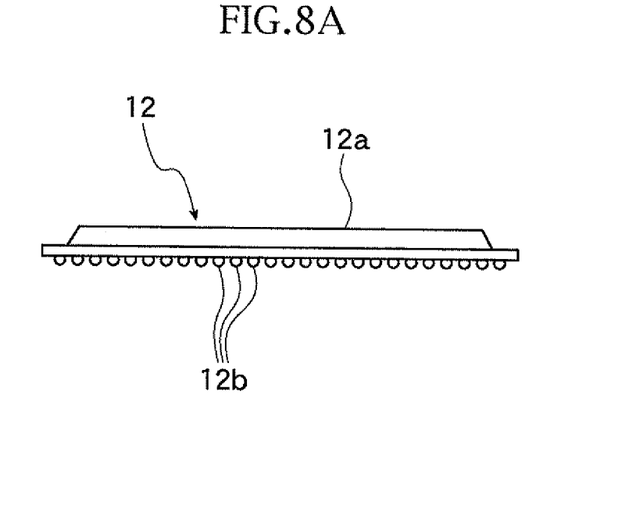
Figure 8B:
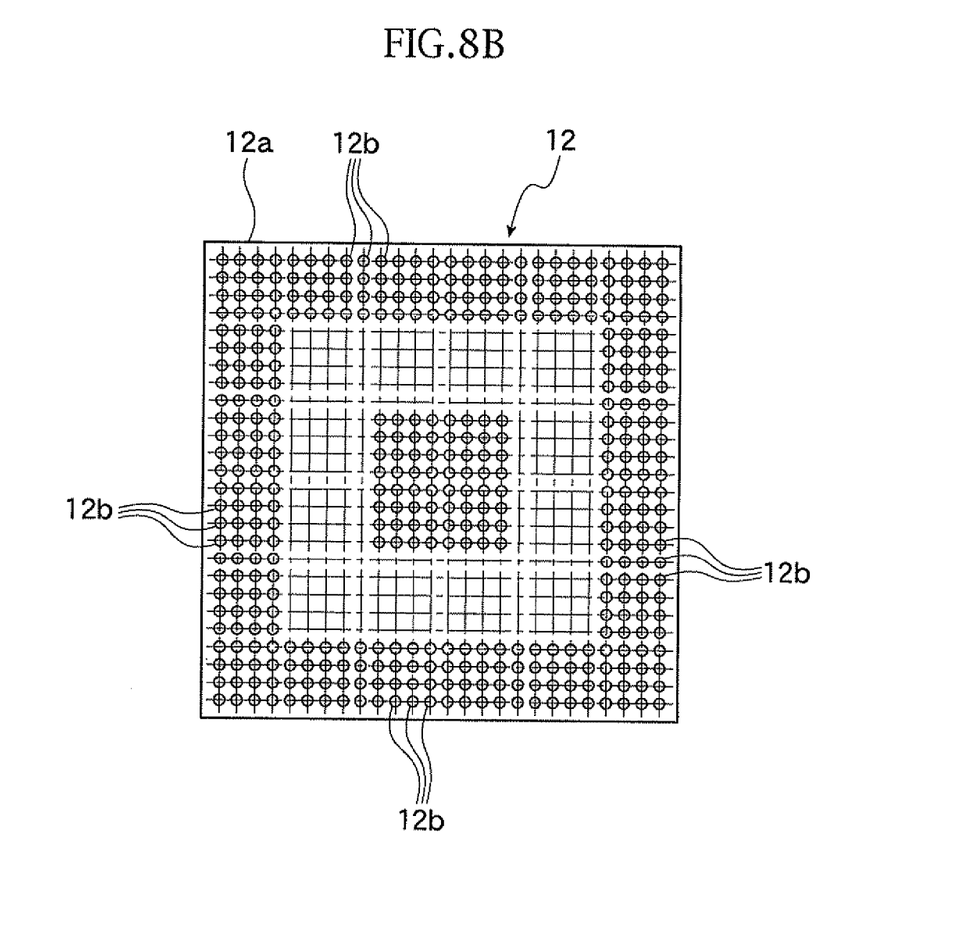

As shown in FIGS. 8A and 8B, a plurality of sphere-like solder balls 12b as a plurality of "terminals" are formed on an under surface of the IC package body 12a as a square-like "electrical part body".

Figure 1:
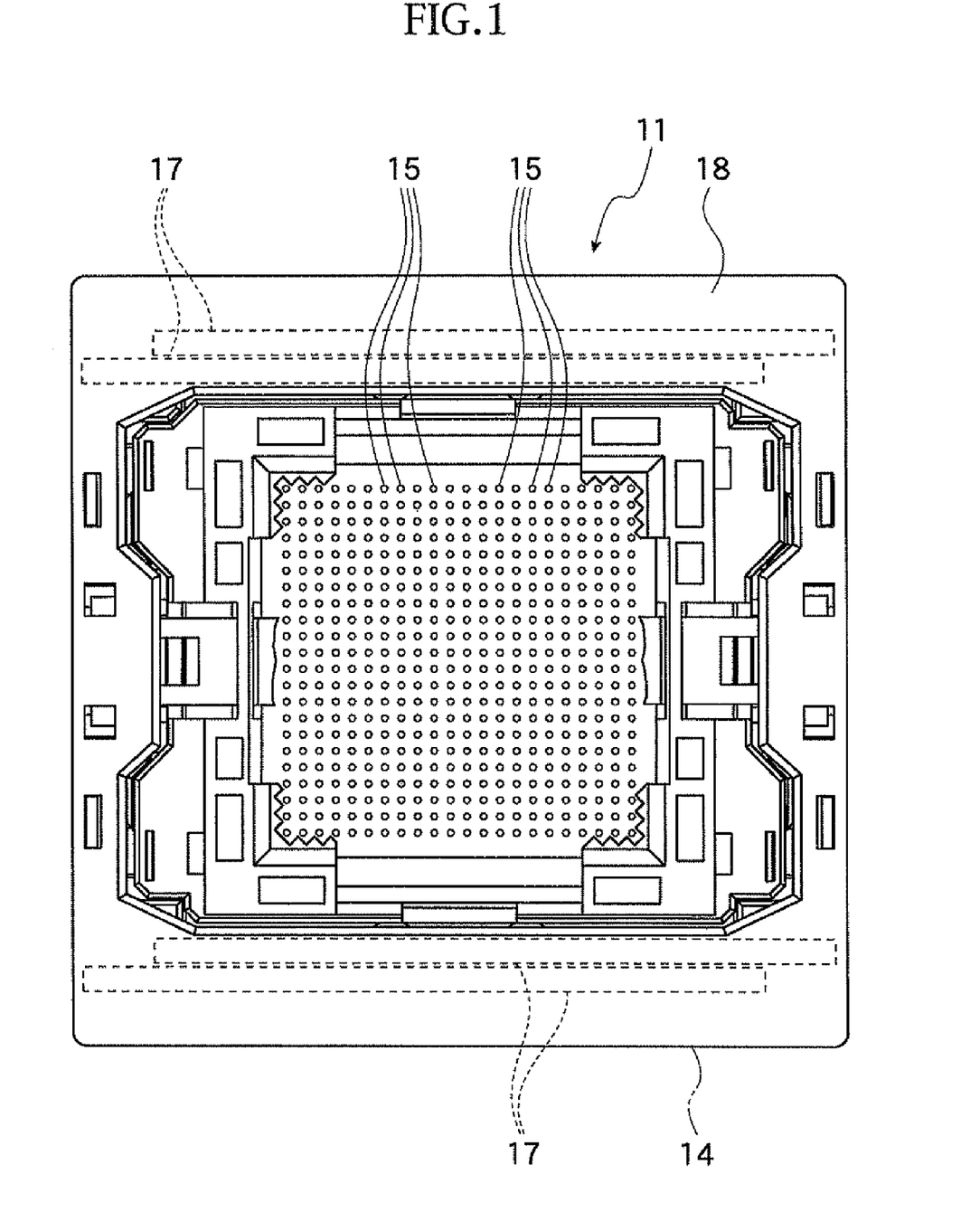
FIG. 1 is a plan view of an IC socket of the first embodiment of the present invention.
Figure 2:
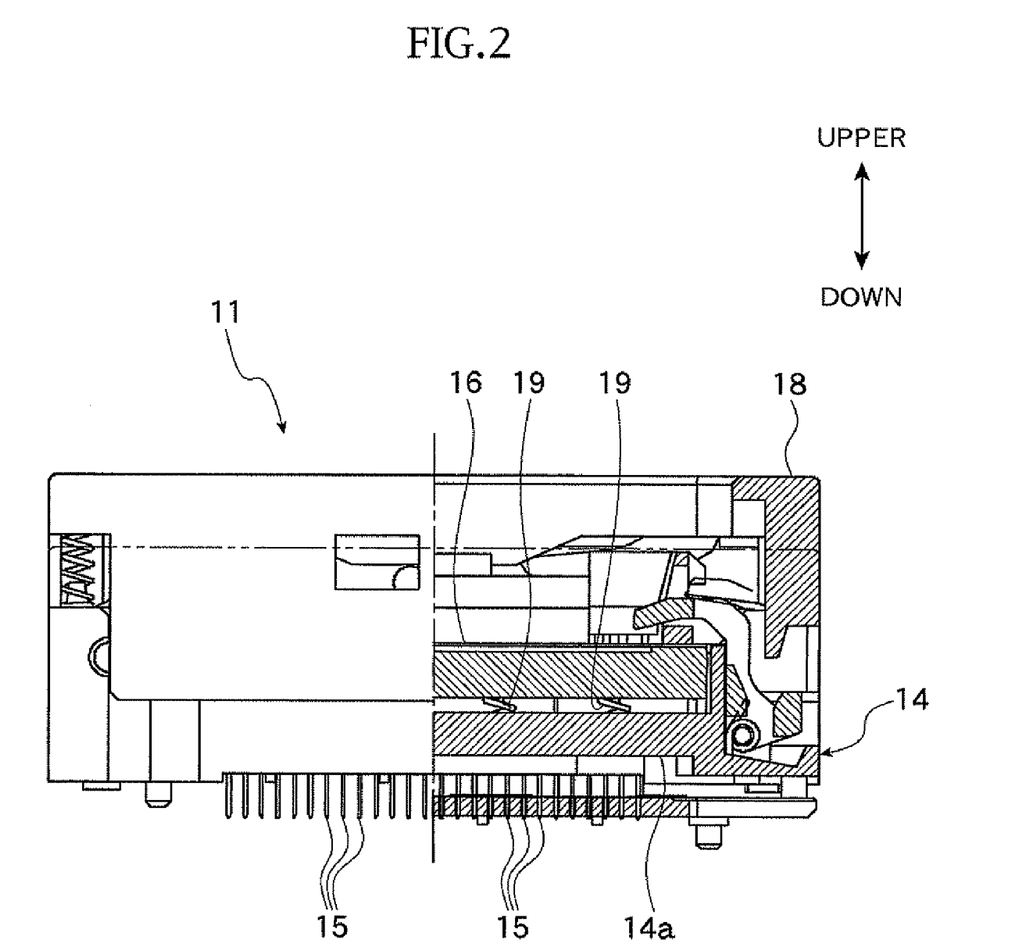
FIG. 2 is a side view of FIG. 1, partially in section of the IC socket of the first embodiment.
Figure 3:
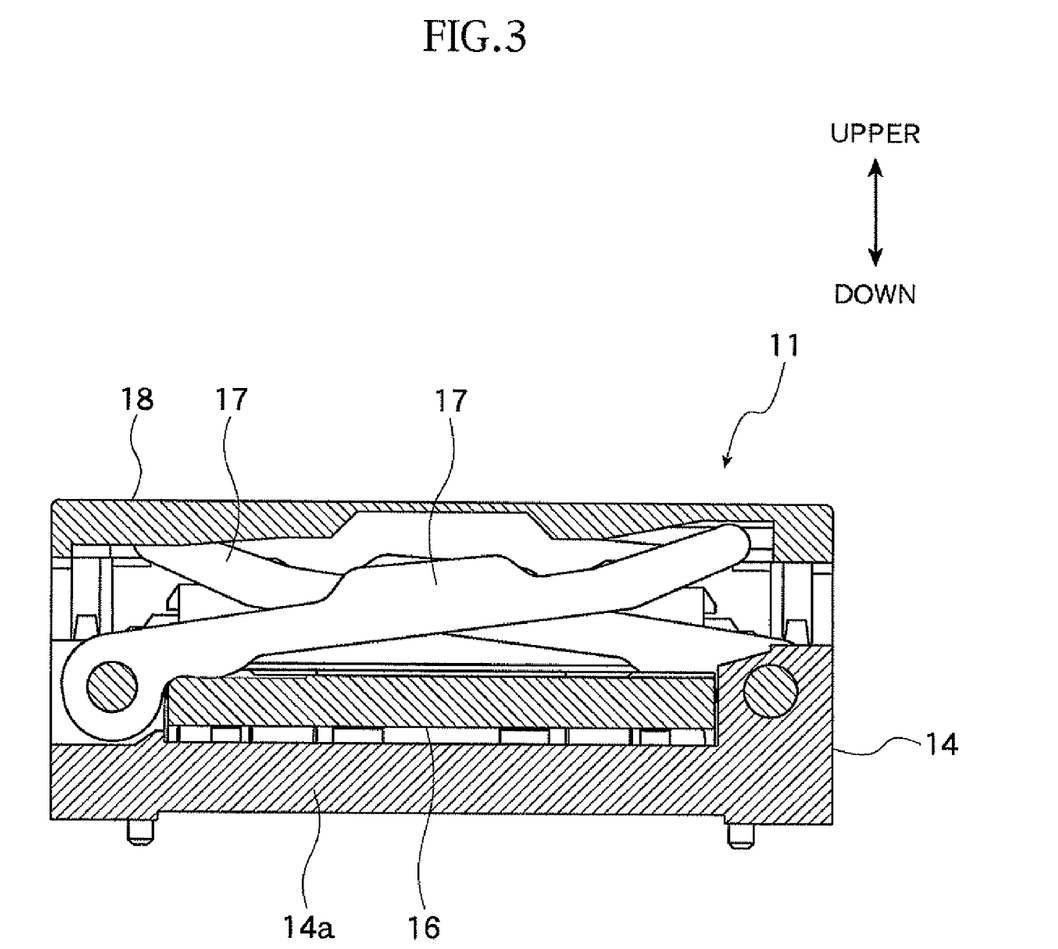
FIG. 3 is a sectional view of FIG. 1 of the IC socket of the first embodiment.

Meanwhile, as shown in FIGS. 1 to 3, the IC socket 11 has a socket body 14, a plurality of contact pins 15 provided for the socket body for electrical connection to a terminal (solder ball 12b) of the IC package 12, a vertically movable (moving) member 16 for causing elastic deformation of the contact pin 15, and an operation (operating) member 18 for causing vertical movement of the movable member 16 through a lever member 17.

The contact pin 15 is formed to have a shape shown in FIGS. 4A and 4B and FIGS. 5A to 5C by firstly punching out a predetermined shape from a piece of conductive plate and then sending it to a bending process (press working). The contact pin has a fixed portion 15e having a bent portion having a U-shaped horizontal cross section. And a lead portion 15a extends downward from the fixed portion 15e and a pair of elastic pieces 15b extends upward from the fixed portion respectively. Such contact pin 15 is inserted into through holes 14d (see FIGS. 6A and 6B) of the socket body 14 and a through hole 16a of the movable member 16. The fixed portion 15e is inserted from beneath into an accommodation portion 14f provided at a lower edge side of a base portion 14a of the socket body 14 and then covered and supported from beneath by a presser plate 14g, thus the contact pin is fixed to the socket body 14. An upper edge 15h of the fixed portion 15e is abutted on an abutting portion 14k at an upper edge of the accommodation portion 14f.

In this embodiment, the contact pin 15 is almost fixed, as mentioned above, by the accommodation portion 14f of the socket body 14 and the presser plate 14g. However there may sometimes be a small clearance in a space formed by the accommodation portion 14f and the presser plate 14g so that in the present invention, a reliable fixation of the contact pin 15 to the socket body 14 can be eventually achieved by making a biting portion 15f of the contact pin 15 bites a bitten portion 14h formed in the through hole 14d of the socket body 14.

The lead portion 15a of the contact pin 15 is elastically deformable, and projects downward from the base portion 14a and is inserted into the wiring board and soldered, establishing an electrical connection to an electrode (not shown).

Figure 4A:
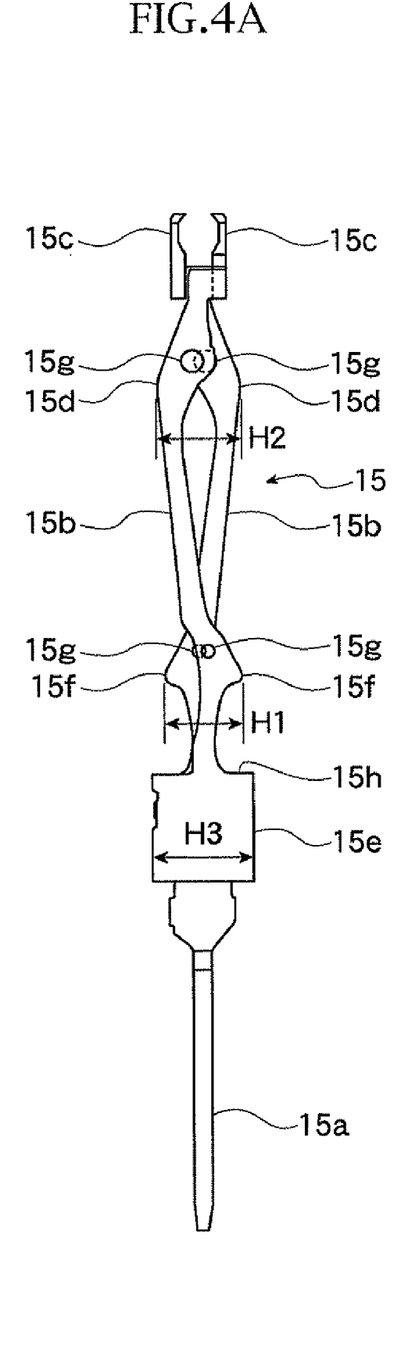

The pair of plate-like elastic pieces 15b of the contact pin are arranged in such a manner that plates surfaces in a plate-width direction of the elastic pieces are each arranged in a face-to-face manner. And this elastic pieces extends toward the movable member 16 provided on an upper side of the base portion 14a of the socket body 14. At the upper edge portions of the pair of elastic pieces 15b, the contact portions 15c which are designed to be contacted with the solder ball 12b of the IC package 12 are formed. End edge portions of the contact portions 15c are bent toward each other as shown in FIG. 4A. This pair of elastic pieces 15b are elastically moved close to or separate from each other when the elastic pieces 15b are pushed by the vertical movement of the movable member 16 so that the contact portions 15c are designed to clamp or depart from the solder ball 12b in connection with the opening and closing movement of the contact portions 15c.

Each elastic piece 15b is formed to be elastically deformable along the plate surface and has a biting portion 15f formed in the vicinity of the fixed portion 15e and protruded along the plate surface in the plate-width direction. The biting portion 15f bites an inner wall of the through hole 14d of the base portion 14a of the socket body 14. The biting portion 15f is designed to bite the inner wall of the through hole 14d by the elastic force of the elastic piece 15b, to give a preload to the elastic piece. More specifically, when the biting portion bites the inner wall, the pair of biting portions 15f press the inner walls of the through hole 14d toward the opposite direction to each other and thus the biting portions 15f are pressed by resulting reaction force so that a width between end edges of the biting portion 15f becomes shorter than the width H1 in FIG. 4A. In addition, the bitten portion is bitten and pressed by the elastic force of the biting portion 15f, therefore vertical movement of the elastic piece 15b is surely restricted and the contact pin 15 is also surely fixed to the socket body 14. At the same time, the preload is given to the elastic piece 15b in a direction of closing the contact portion 15c (in a direction the contact portion 15c comes close to the solder ball 12b).

In the vicinity of the contact portion 15c of each elastic piece 15b, an operation portion 15d is provided in a direction along the plate surface but is protruded in a direction opposite to the extending direction of the biting portion 15f. The operation portion 15d is pressed against an inner wall of the through hole 16a of the movable member 16 and is designed to slide on the inner wall by the movement of the movable member 16.

Figure 4B:
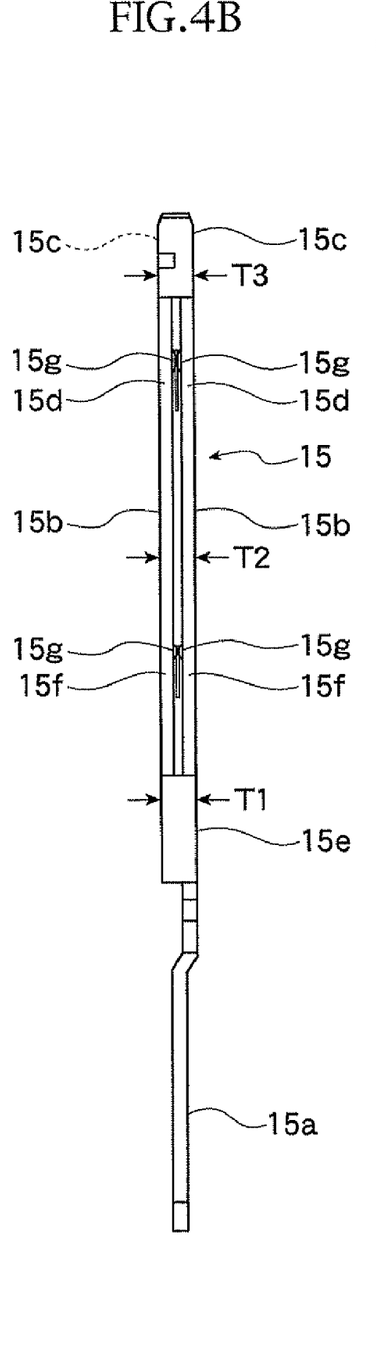

The biting portion 15f and the operation portion 15d between the pair of elastic pieces 15b are formed to protrude toward the directions opposite to each other respectively. Before the elastic piece is mounted on the socket body 14 or before the elastic piece is elastically deformed, as shown in FIGS. 4A and 4B, the width H1 between the end edges of the two biting portions 15f and the width H2 between the end edges of the two operation portions 15d are made narrower than the width H3 of the fixed portion 15e. In other words, the width between the end edges of the paired biting portions 15f after the elastic pieces is elastically deformed is narrower than the width H1 before the elastic pieces are elastically deformed. The biting portion 15f is formed between the fixed portion 15e and the contact portion 15c. And the contact portion 15c can give the preload to the terminal as long as the biting portion 15f is not in close contact with the fixed portion 15e.

In the vicinity of the biting portion 15f and the operation portion 15d of the pair of elastic pieces 15, protrusions 15g having the same length are projected toward each other in such a manner that one protrusion is sliding on the other protrusion. The protrusions 15g have such a size that each protrusion can slide on the opposite protrusion when the pair of elastic pieces 15 are in operation. In addition, when the protrusions 15g of this contact pin 15 are slidably contacted to the opposite protrusion, a thickness T1 of the fixed portion 15e in the direction perpendicular to the plate surface, a thickness T2 of the pair of elastic pieces 15 in a direction perpendicular to the plate surface (in a direction of plate thickness) which are placed parallel to each other and a thickness T3 of contact portions 15c have all the same thickness.

Figure 6A:
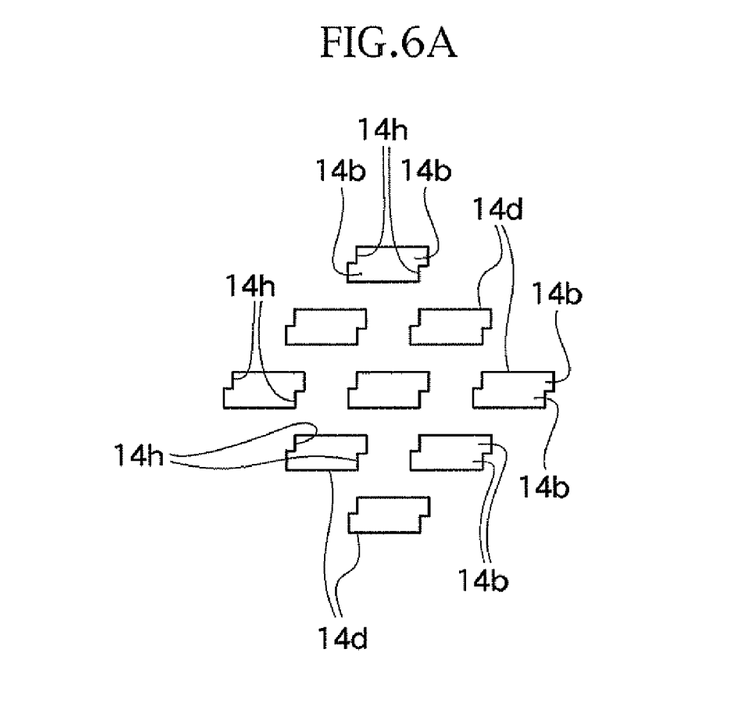
Figure 6B:
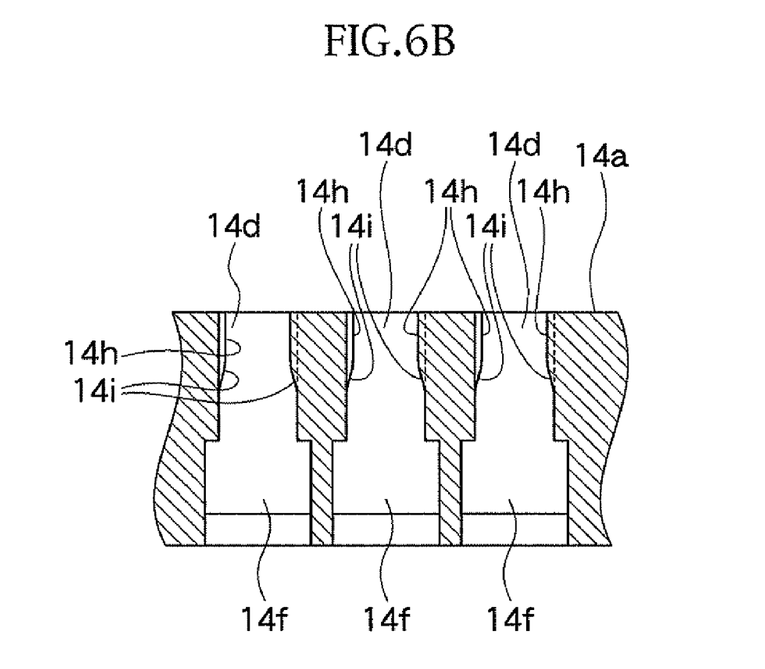

In the socket body 14 having such contact pin 15, as shown in FIGS. 6A and 6B, respective through holes 14d provided in the base portion 14a has a pair of elastic-piece-arrangement (arranging) portions 14b, 14b extending upward continuously from the accommodation portion 14f which accommodates the fixed portion 15e of the contact pin 15. The pair of elastic pieces 15b are inserted into the pair of elastic-piece-arrangement portions 14b, 14b.

In respective elastic-piece-arrangement portions 14b, 14b, the bitten portion 14h designed to be bitten by the biting portion 15f of each elastic piece 15b protrudes toward an inner side of the through hole. The bitten portion 14h has a guide surface 14i which becomes gradually narrower toward upward direction from the lower portion of the bitten portion 14h. When the contact pin 15 is inserted into and fixed to the socket body 14, the bitten portion 14h presses the biting portion 15f toward inner side of the through hole in proportion to the amount of protrusion, thereby a preload in the direction of closing the contact portion is given to the elastic piece 15b. In other word, the bitten portion 14h presses the biting portion 15f, thus the plane width H1 between the end edges of the biting portions 15f is made narrower, and thus the preload is generated by the elasticity of the elastic piece 15b. Therefore, the shape and the amount of protrusion toward the inner side at the bitten portion 14h should be designed so as to obtain a desired amount of the preload.

The bitten portion 14h is formed at an area extending from the vicinity of the lower portion of the biting portion 15f to the upper portion of the biting portion when the contact pin 15 is mounted in the socket body 14. This is because a sliding distance of the biting portion 15f which slides on the bitten portion 14h at the time of mounting the contact pin 15 in the socket body can be made smaller.

Figure 5A:
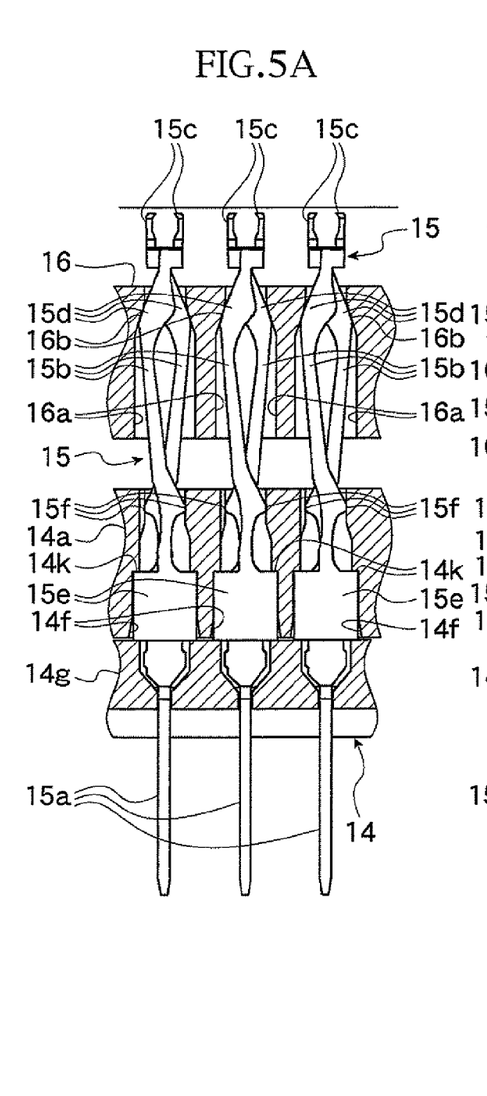
Figure 5B:
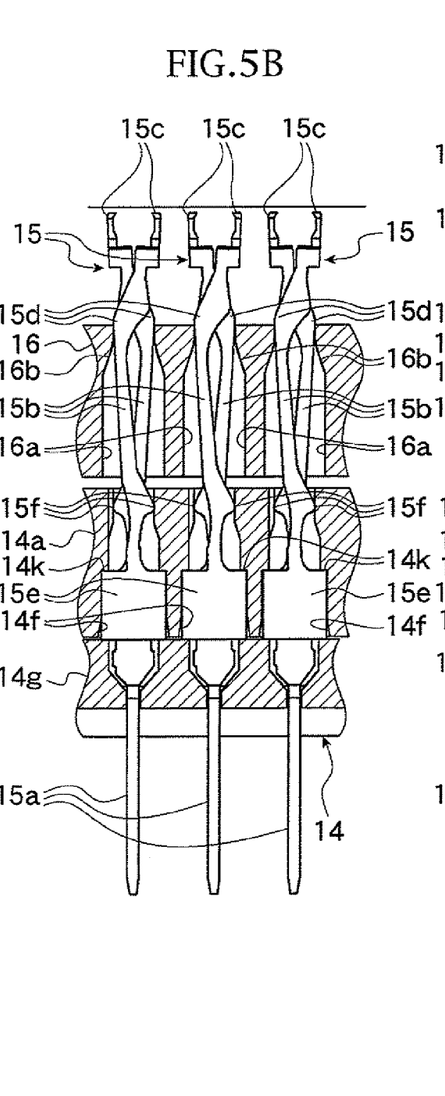
Figure 5C:
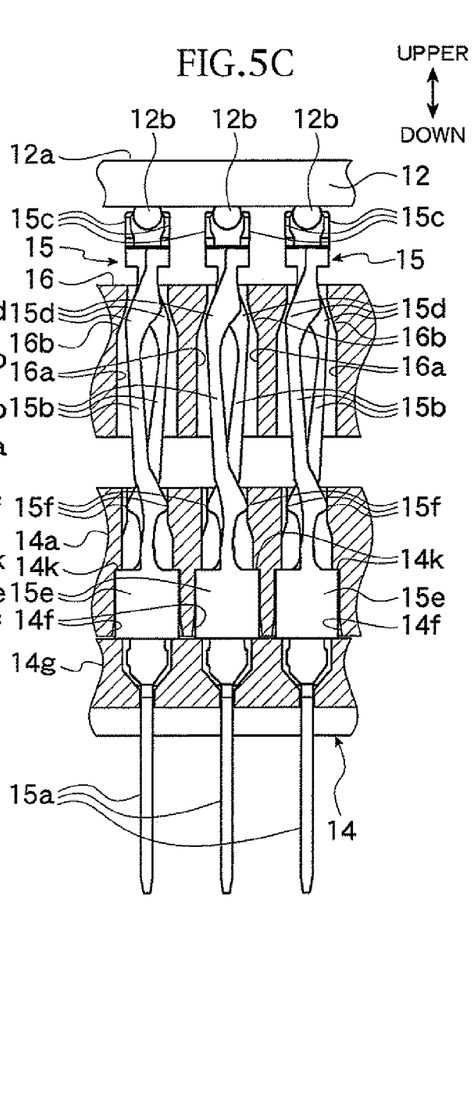

As shown in FIGS. 1 to 3 and FIGS. 5A to 5C, the movable member 16 to be disposed on an upper side of the base portion 14a of the socket body 14 has a plate-like shape and is disposed vertically movable and is urged upward by a spring 19. The movable member 16 has a plurality of through holes 16a corresponding to a plurality of contact pins 15 and into each through hole 16a, a pair of elastic pieces 15b of the contact pin 15 is inserted. The operation portion 15d of the elastic piece 15b is designed to be pushed by a cum portion 16b formed on the inner wall of the through hole 16a. When the movable member 16 is moved downward, the operation portion 15d of the elastic piece 15b is designed to be pushed by the cum portion 16b (from a state shown in FIG. 5A to a state shown in FIG. 5B), and the pair of elastic pieces 15b are elastically deformed and then the pair of contact portions 15c are opened. After the IC package 12 is accommodated in the IC socket 11, the solder ball 12b is designed to be clamped between the pair of contact portions 15c as shown in FIG. 5C when the movable member 16 is moved upward by using an urging force of the spring 19.

Next, assembling of such IC sockets 11 mentioned above will be explained.

Figure 7A:
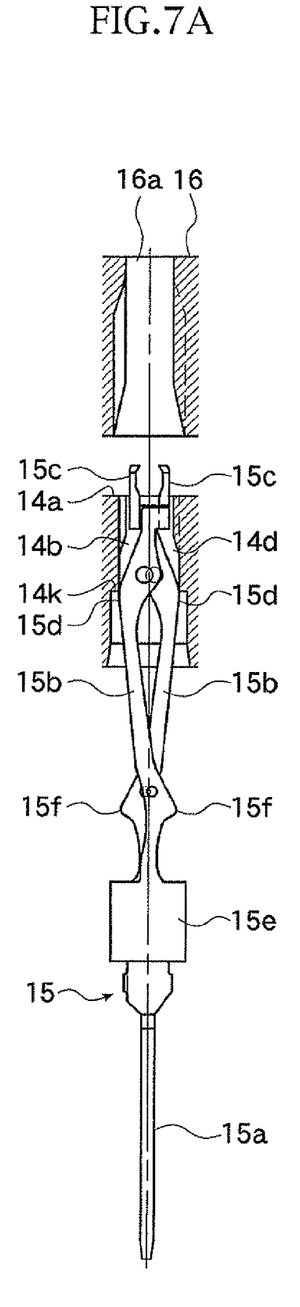
FIG. 7A to FIG. 7C show a mounting process of a contact pin of the first embodiment of the present invention.
Figure 7B:
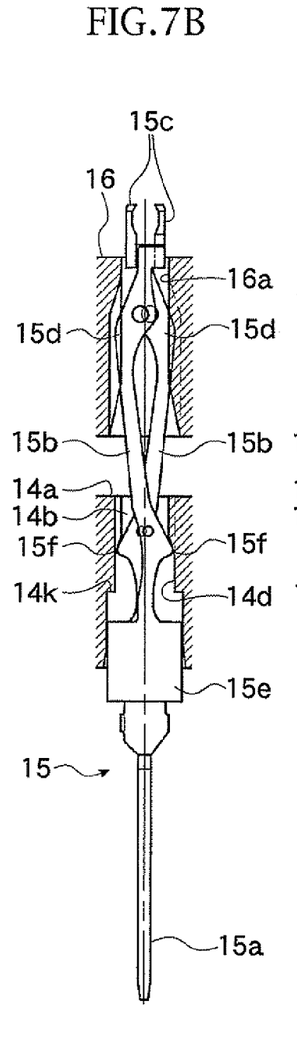
Figure 7C:
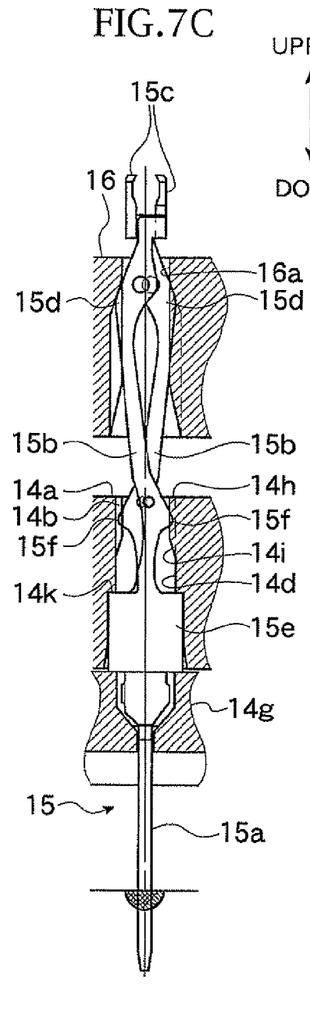

Firstly, when the contact pin 15 is inserted into and fixed to the socket body 14 and the movable member 16, as shown in FIGS. 7A to 7C, the contact portion 15c, the end edge side of the contact pin 15, is inserted from beneath into respective through holes 14d and 16a of the socket body 14 and the movable member 16 respectively. At this time, a projected size or area, projected in the inserting direction, of a pair of elastic-piece-arrangement portions 14b, 14b of the through hole 14d of the socket body 14 is made larger than that of the contact portion 15c and the operation portion 15d of the pair of elastic pieces 15b of the contact pin 15. Therefore, when the contact pin is inserted into each through holes 14d from beneath, the elastic piece 15b can be inserted under substantially non-contact condition without causing pressurized contact with the inner wall of the through hole 14d during the insertion process from a state shown in FIG. 7A (insertion starting state) to a state shown in FIG. 7B (a state in which the biting portion 15f is reached to the guiding surface 14i).

And then each biting portion 15f is further slidably moved upward by maintaining contact with each guiding surface 14i respectively, and a fixed portion 15e of the contact pin 15 is accommodated into the accommodation portion 14f of the through hole 14d as shown in FIG. 7C and the upper edge of the fixed portion 15e abuts on the abutting portion 14k of the accommodation portion 14f. And each biting portion 15f reaches to the bitten portion 14h and finally each biting portion 15f is fixed under a state where the biting portion bites the bitten portion 14h by the elastic force of the elastic piece 15b. And then, a presser plate 14g is attached from beneath, then the assembling processes of the contact pin 15 is completed and thus the IC socket 11 is obtained.

According to the IC socket 11 having the structure mentioned above, the contact pin 15 has the biting portion 15f in the vicinity of the fixed portion 15e, which bites the inner wall of the through hole 14d of the socket body 14. The vertical movement of the elastic piece 15b is restricted while the biting portion 15f bites the inner wall. Therefore, there is no need to strongly press the fixed portion 15e itself into the through hole 14d of the socket body 14. The contact pin 15 can be securely fixed to the socket body 14 with much smaller force.

The biting portion 15f which restricts the vertical movement of the contact pin 15 is formed to be positioned closer to the side of the contact portion 15c than that of the fixed portion 15e which only restricts the upward movement of the contact pin, and the biting portion is supported between the contact portion and the fixed portion, therefore the contact portion can be shifted somewhat rotatably around the biting portion 15f of the contact portion 15 as a supporting point. Even if there is a small positional displacement between the through hole 14d of the socket body 14 and the through hole 16a of the movable member 16, such displacement can be absorbed so that the IC socket 11 can be assembled. Therefore, the assembling of the IC socket 11 can be performed smoothly and the yield rate can be improved.

At the same time, on the elastic piece 15b which is designed to be elastically deformable in the direction of the plate width so as to enable the contact pin to contact with and separate from the solder ball 12b, above-mentioned biting portion 15f which protrudes along the plate surface in the direction of the plate width is provided between the fixed portion 15e and the contact portion 15c. Therefore, the biting portion 15f can be formed easily and accurately on the elastic piece 15b using punching out process (or punching operation) or the like. Such preload generation structure that gives preload accurately can be formed easily.

The contact pin 15 also has the operation portion 15d to be inserted into the through hole 16a of the movable member 16 and pressed when the movable member 16 is moved downward. The operation portion 15d and the biting portion 15f are protruded oppositely to each other so that the elastic piece 15b is positionally controlled by both the lowly-placed biting portion 15*f* and the highly-placed operation portion 15*d*, being able to make the elastic piece 15*b* maintain the normal position.

Furthermore, the through hole 14*d* of the socket body 14 into which the contact pin 15 can be inserted from beneath has the abutting portion 14*k* abutting on the upper edge 15*h* of the fixed portion 15*e* such that the upward movement of the elastic piece 15*b* is restricted.

The through hole 14*d* of the socket body 14 has the bitten portion 14*h* of the base portion 14*a* protruding toward the inner side of the through hole. The guiding surface 14*i* is formed to be inclined and configured such that a distance between the inner walls opposite to each other is made narrower toward the upward direction from the lower portion of the bitten portion 14*h*. Therefore, at the time when the contact pin 15 is inserted into the through hole 14*d* of the socket body 14, the biting portion 15*f* is not pressed by the through hole 14*d* until the biting portion 15*f* reaches to the guiding surface 14*i* so that the area where the biting portion is not pressed is prevented from being scraped away by the biting portion 15*f*. Thereafter the biting portion 15*f* is smoothly guided due to the presence of the inclined surface. Thus, the contact pin 15 can be smoothly inserted and securely fixed to the socket body 15.

Further, the plate surfaces extending in the plate width direction of the pair of elastic pieces 15*b* are arranged oppositely to each other so that the biting portions 15*f*, 15*f* of the elastic pieces 15*b*, 15*b* are designed to bite the inner wall of the through hole 14*d*, being able to restrict the vertical movement of the contact pin 15. Thus the contact pin 15 can be more securely fixed to the socket body 14.

Further, in addition to the elastic force from the elastic pieces 1*b*, 15*b* which is used to clamp the solder ball 12*b* of the IC package 12 by the contact portions 15*c*, 15*c* of the elastic pieces 15*b*, 15*b*, the preload applied on the biting portions 15*f* toward the closing direction of the contact portions 15*c*, 15*c* of the contact pin 15 caused by the pressure from the inner wall of the through hole 14*d* is also used as the contacting force, thus the solder ball 12*b* is much surely clamped.

Further, the pair of elastic pieces 15*b*, 15*b* have protrusions 15*g*, 15*g* formed on the plate surfaces opposite to each other in the vicinity of the biting portions 15*f*, 15*f* and the operation portions 15*d*, 15*d*. The protrusions opposite to each other slide on the other protrusion. Thus the elastic pieces 15*b*, 15*b* both at the upper and lower portions of the elastic pieces can be positioned and can be controlled to have the same distance from each other, being able to realize smooth operation of the two elastic pieces 15*b*, 15*b*.

In the first embodiment mentioned above, the contact pin 15 has a pair of elastic pieces 15*b*, 15*b*, but the present invention is not limited to such embodiment. The present invention is applicable as well to a contact pin having only one elastic piece extending upward from the fixed portion 15*e* as long as the upward movement is restricted by both the upper edge 15*h* of the fixed portion 15*e* and the biting portion 15*f* and also the shape of biting portion 15*f* and the bitten portion 14*h* is suitably designed. In addition, in the embodiment mentioned above, the pair of elastic pieces 15*b*, 15*b* of the contact pin 15 is structured to intersect with each other so that the elastic force of the elastic piece 15*b* acts toward the direction of opening of the contact portion 15*c*, 15*c*. On the contrary, the pair of elastic pieces 15*b*, 15*b* can be structured not to intersect with each other so that the elastic force acts toward the direction of closing the contact portions 15*c*, 15*c*.

Further, in the embodiment mentioned above, the movable member 16 is explained as the one that has a plate-like shape and is vertically movable. But, a member movably horizontally can be applied to the present invention.

In addition, in the embodiments mentioned above, the biting portion 15*f* is formed on the side of the fixed portion 15*e* between the fixed portion 15*e* and the contact portion 15*c*. But, if the biting portion 15*f* is positioned too close to the fixed portion 15*e*, the elastic piece 15*b* becomes hardly deformable so that the resulting preload becomes small. On the contrary, if the biting portion is set at a position far from the fixed portion 15*e* (or too close to the contact portion 15*c*), elastic force becomes weak and accordingly the resulting preload also becomes weak. Accordingly, the biting portion should be formed at a predetermined distance apart from the contact portion 15*c* and at a certain distance apart from the fixed portion 15*e* so as to ensure a necessary preload.

Further, in the embodiments mentioned above, the protrusions 15*g* all have the same protrusion amount (protrusion length). But the protrusion amount may be made different from each other. In addition, the protrusion 15*b* can be made only on one of the elastic pieces 15*b*. Further, the protrusions 15*g* in the embodiment are formed in the vicinity of both the biting portion 15*f* and the operation portion 15*d*, but can be formed in the vicinity of either one of them.

Second Embodiment

Figure 9:
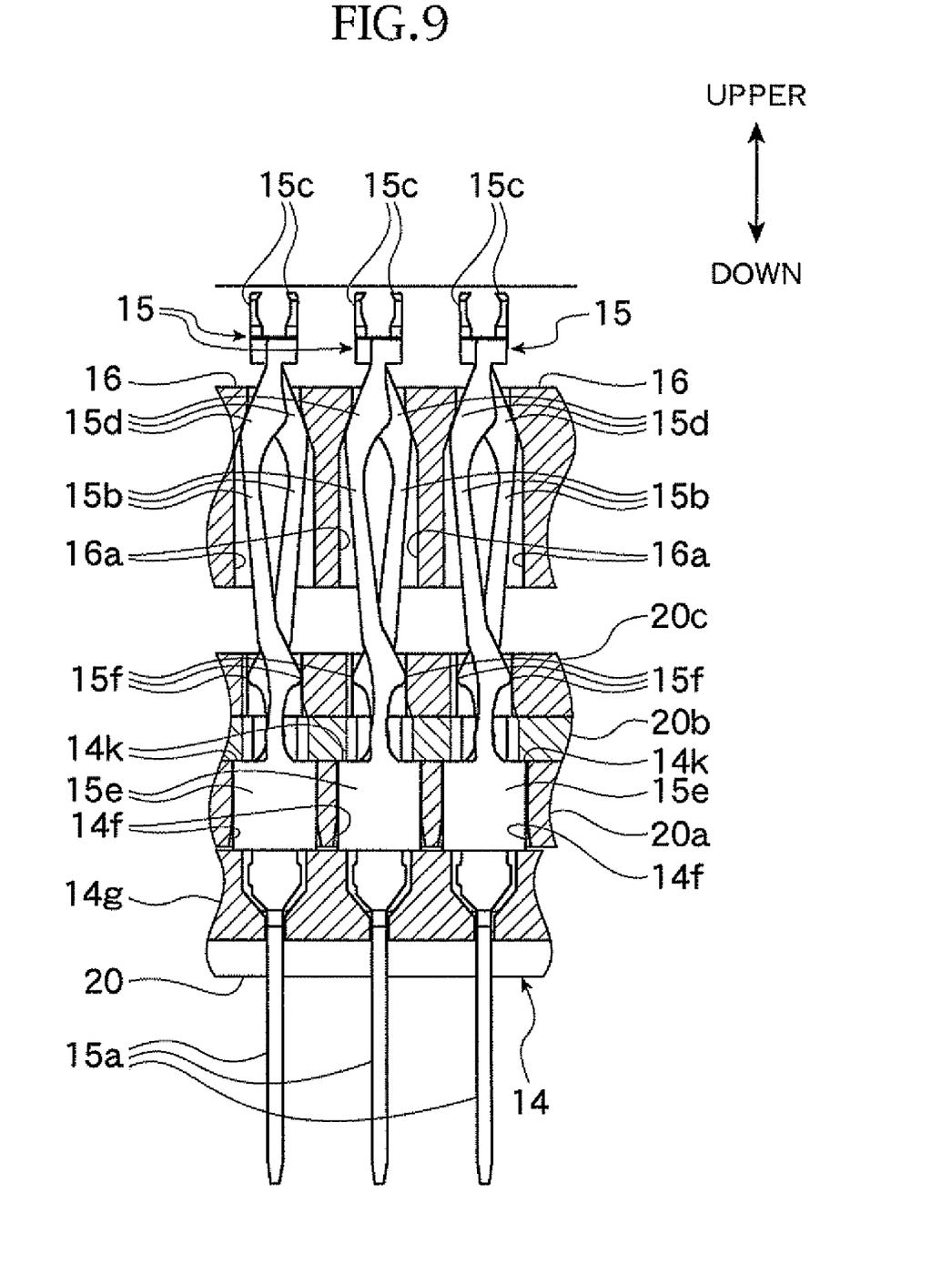
FIG. 9 is an enlarged sectional view of an essential part of an IC socket of a second embodiment of the present invention.

FIG. 9 represents the second embodiment.

The second embodiment has the same structure as that of the first embodiment except that a socket body 20 has a structure different from the first embodiment.

The socket body 20 of the second embodiment has a body plate 20*a* having an accommodation portion 14*f* of a fixed portion 15*e* of a contact pin 15, a bottom plate 20*b* laminated on and fixed to the body plate 20*a* and having an abutting portion 14*k* which is structured to be an upper edge of the accommodation portion 14*f*, a middle plate 20*c* having a pair of elastic-piece-arrangement portions 14*b*, 14*b* which are connected to each other, and a presser plate 14*g* laminated on a lower surface of the body plate 20*a* for preventing the contact pin from falling off.

In the socket body 20, when an upper portion of the body plate 20*a* is opened or when the bottom plate 20*b* is not placed on the body plate 20*a*, the fixed portion 15*e* can be accommodated into the accommodation portion 14*f* by inserting the contact pin 15 from above into the body plate 20*a*. Thereafter, the bottom plate 20*b* and the middle plate 20*c* are assembled from above or the side and then respective plates 20*a*, 20*b*, 20*c* are fixed, being able to complete the mounting process in which the contact pin 15 is mounted in the socket body 20.

At this time, a vertical position of the contact pin 15 can be determined by making the upper edge of the fixed portion 15*e* of the contact pin 15 abut on the abutting portion 14*k* of the bottom plate 20*b*.

Same effects as obtained in the first embodiment can be obtained by using such socket body 20 of the second embodiment. Further, in the second embodiment, the contact pin 15 can be inserted from above into the socket body 20 so that the freedom of assembling the IC socket 11 can be improved.

The invention claimed is:

1. A socket for an electrical part, comprising:
a socket body; and
a contact pin having a contact portion for contacting a terminal of the electrical part, the contact pin being disposed in the socket body by being inserted into a through hole of the socket body,
wherein
the contact pin comprises a fixed portion by which the contact pin is fixed to the socket body, and a plate-like elastic piece extending upward from the fixed portion;

the fixed portion is fixed when the fixed portion is inserted into the through hole of the socket body;

the elastic piece of the contact pin is formed to be elastically deformable in a plate-width direction of the elastic piece such that the contact portion of the contact pin is contacted to and separated from the terminal; the contact pin being provided with a biting portion located between the fixed portion and the contact portion and protruding along a plate surface in the plate-width direction, and designed to bite an inner wall of the through hole of the socket body;

the biting portion forms a bitten portion on the inner wall by biting the inner wall;

when the biting portion bites the bitten portion on the inner wall, the vertical movement of the contact pin is restricted and at the same time, the biting portion is pressed by the inner wall so that a preload is given to the elastic piece in a direction of closing the contact portion of the elastic piece, a movable member movable with respect to the socket body is disposed on an upper side of the socket body;

an operation portion, which is inserted into a through hole of the movable member and pressed at the time the movable member is moved, is provided on the elastic piece of the contact pin; and the operation portion and the biting portion are protruded in a direction opposite to each other.

2. The socket for an electrical part according to claim 1, wherein, the movable member is disposed to be vertically movable with respect to the socket body; and the operation portion of the contact pin is pressed at the time of downward movement of the movable member.

3. The socket for an electrical parts according to claim 1, wherein, insertion of the contact pin into the through hole of the socket body is carried out by inserting an end edge of the contact portion side of the contact pin into the through hole from the lower side of the through hole; and the through hole has an abutting portion which abuts on an upper edge of the fixed portion so as to restrict an upward movement of the contact pin.

4. The socket for an electrical part according to claim 1, wherein, a guiding surface is formed at a lower portion of the bitten portion, on which the biting portion slides at the time of insertion of the contact pin; and the guiding surface is formed such that a distance between the inner walls opposite to each other is made narrower toward the upward direction from the lower portion of the bitten portion.

5. The socket for an electrical part according to claim 1, wherein, the elastic piece is a pair of elastic pieces, and the plate surfaces of the elastic pieces in the plate-width direction are placed opposite to each other.

6. The socket for an electrical part according to claim 5, wherein, the pair of elastic pieces has a protrusion formed on at least one of the pair of elastic pieces and in the vicinities of both or either one of the biting portion and the operation portion, the protrusion slides on a surface of the other elastic piece opposite to the protrusion.

* * * * *